(12) United States Patent
Jain

(10) Patent No.: US 6,300,791 B1
(45) Date of Patent: Oct. 9, 2001

(54) SIGNATURE GENERATOR CIRCUIT

(75) Inventor: Manish Jain, Aix-en-Provence (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/452,325

(22) Filed: Nov. 30, 1999

(30) Foreign Application Priority Data

Nov. 30, 1998 (FR) .................................................. 98 15249

(51) Int. Cl.⁷ ...................................................... G06F 7/38
(52) U.S. Cl. ................................ 326/38; 326/93; 326/37; 327/141
(58) Field of Search ................................ 326/93, 37, 38; 327/141, 142, 146

(56) References Cited

U.S. PATENT DOCUMENTS

| 4,216,374 | * | 8/1980 | Lam et al. | 371/27 |
| 4,320,509 | * | 3/1982 | Davidson | 371/25 |
| 5,167,020 | | 11/1992 | Kahn et al. | |
| 5,228,042 | | 7/1993 | Gauthier et al. | |
| 5,302,866 | * | 4/1994 | Chiang et al. | 307/465 |

FOREIGN PATENT DOCUMENTS 0 805 575   11/1997 (EP) .
2 062 042   5/1981 (GB) .

* cited by examiner

*Primary Examiner*—Michael Tokar
*Assistant Examiner*—Anh Tran
(74) *Attorney, Agent, or Firm*—Theodore E. Galanthay; Stephen Bongini; Fleit, Kain, Gibbons, Gutman & Bongini P.L.

(57) ABSTRACT

A signature generator circuit is provided for generating a signature word relating to a plurality of words. The signature generator circuit includes a logic gate that receives the plurality of words in series at one input, and a shift register that has a data input, a clock input, and a register output. The clock input receives a clock signal that sets the rate of the plurality of words, the data input is coupled to the output of the logic gate, and the register output is coupled to another input of the logic gate. In a preferred embodiment, the shift register also has a parallel output for outputting the contents of the shift register. Also provided is a method for generating a signature relating to a plurality of words using a logic gate and a shift register. The contents of the shift register are reset. One of the words is supplied in series to the logic gate, at least one of the bits in the shift register is also supplied to the logic gate, and the output of the logic gate is stored in the shift register. The latter three steps are repeated for each of the words.

18 Claims, 1 Drawing Sheet

SIGNATURE GENERATOR CIRCUIT

CROSS-REFERENCE TO RELATED APPLICATIONS

This application is based upon and claims priority from prior French Patent Application No. 98-15249, filed Nov. 30, 1998, the entire disclosure of which is herein incorporated by reference.

BACKGROUND OF THE INVENTION

1. Field of the Invention

The present invention relates to integrated circuits, and more specifically to a signature generator circuit for checking the validity of data.

2. Description of Related Art

The principle of integrated circuit transponders is to allow a reader to check the transponder and/or leave a trace in the transponder with minimum handling (it is enough for the transponder to be in the vicinity of a reader). Generally, the transponders are small-sized objects (credit card-sized badges, tags, or car keys) and they are not provided with an independent power source. To operate, the transponder is provided with a small antenna that picks up a modulated magnetic field. An integrated circuit connected to the two terminals of the antenna produces a supply voltage from this field and then demodulates and/or modulates the magnetic field to communicate with the reader.

Various problems arise in integrated circuits designed for use in transponders. The integrated circuits have to be small so that they can be placed in different objects without being destroyed by mechanical deformations of the object in which they are placed. Also, the consumption of the integrated circuits must be reduced to a minimum because the received supply does not make it possible to obtain a great deal of power. A greater problem arises in the transmission of data. Indeed, the data is modulated on a magnetic field that may be noise infested in varying degrees.

Furthermore, the constraints on size and consumption of the integrated circuit do not allow for a complicated error correction device. There are known ways of using a double check on parity. The double check on parity consists in checking the parity of each transmitted word and in checking a parity signature on a certain number of successively transmitted words. However, better error detection in transponder integrated circuits is desirable.

SUMMARY OF THE INVENTION

In view of these drawbacks, it is an object of the present invention to overcome the above-mentioned drawbacks and to provide a small, low consumption signature generator circuit.

Another object of the present invention is to provide a signature generator circuit that is non-specific as to the number of words to be taken into account in a parity check. Thus, the circuit can produce a signature on a variable number of words.

One embodiment of the present invention provides a signature generator circuit for generator a signature word relating to a plurality of words. The signature generator circuit includes a logic gate that receives the plurality of words in series at one input, and a shift register that has a data input, a clock input, and a register output. The clock input receives a clock signal that sets the rate of the plurality of words, the data input is coupled to the output of the logic gate, and the register output is coupled to another input of the logic gate. In a preferred embodiment, the shift register also has a parallel output for outputting the contents of the shift register, and an asynchronous resetting input for resetting the contents of the shift register using a pulse.

Another embodiment of the present invention provides a method for generating a signature relating to a plurality of words using a logic gate and a shift register. According to the method, the contents of the shift register are reset. One of the words is supplied in series to the logic gate, at least one of the bits in the shift register is also supplied to the logic gate, and the output of the logic gate is stored in the shift register. The latter three steps are repeated for each of the words. In one preferred embodiment, the signature is retrieved from the shift register by outputting the contents of the shift register in parallel.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
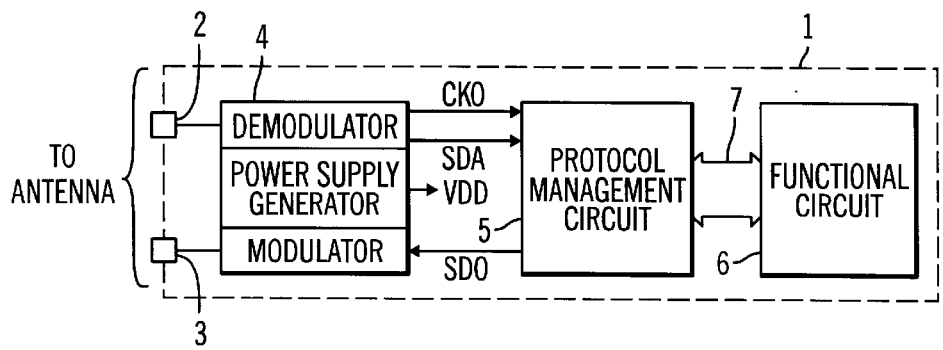
FIG. 1 is a block diagram of an integrated circuit for use in a contactless device.

FIG. 1 shows an integrated circuit that is designed to be used in a contactless device. The integrated circuit 1 has two connection terminals 2 and 3 for communicating with the exterior. Typically, the two terminals 2 and 3 are connected to an antenna (not shown). To aid in this explanation, the integrated circuit 1 has been illustratively subdivided into an input circuit 4, a protocol management circuit 5, and a functional circuit 6. In various embodiments, these functions of the integrated circuit are implemented in hardware, software, or a combination of the two.

The input circuit 4 is connected to the two terminals 2 and 3 and includes a power circuit functional block that provides a power supply voltage VDD to the entire integrated circuit 1 and a modulator and demodulator functional block. The demodulator functional block enables the extraction, from signals coming from the terminals 2 and 3, of a clock signal CK0 that is used to manage the integrated circuit 1 and a data flow signal SDA when data is received. The modulator functional block receives a data signal SDO to be sent and modulates the carrier of the signal to the antenna as a function of the signal SDO to send the data contained in signal SDO.

The protocol management circuit 5 receives the clock signal CK0 and a signal SDA and then ascertains whether the data is accurately received. It then sends a signal indicating good (and/or poor) reception at the reception of a block of data and transmits the data to the functional circuit 6 through a bus 7. The functional circuit 6 may be any type of circuit suited to a particular application. For example, the functional circuit 6 may be an EEPROM type 8-bit memory having a standard set of instructions (for example, for reading an address, writing to an address, reading by page, and protection of the memory). The bus 7 corresponds to the standard address, data, and control busses of a memory.

The protocol management circuit acts as an interface between the bus 7 and the exterior. For this purpose, a slave-type protocol is used so that the integrated circuit receives, for example, an instruction word possibly followed by one or more address words and/or data words. Each instruction transmission includes possibly one or more addresses and/or data elements followed by a signature word that enables the checking of the integrity of the words transmitted. Furthermore, to each word transmitted, there corresponds a transmission frame including a frame start bit, a word to be transmitted, two type bits (to indicate whether the transmitted word is an instruction, an address, data, or a signature), and a frame parity bit.

During the reception of the complete instruction, the integrated circuit sends a word indicating good or poor reception after checking the parity of each frame and verifying the signature. When a read operation is requested from the integrated circuit, it sends one or more data words (simple reading or page reading) followed by a signature word, in using frames of the same type. Depending on the instruction sent, the number of words to be taken into account for the signature may vary as a function of the instruction.

Figure 2:
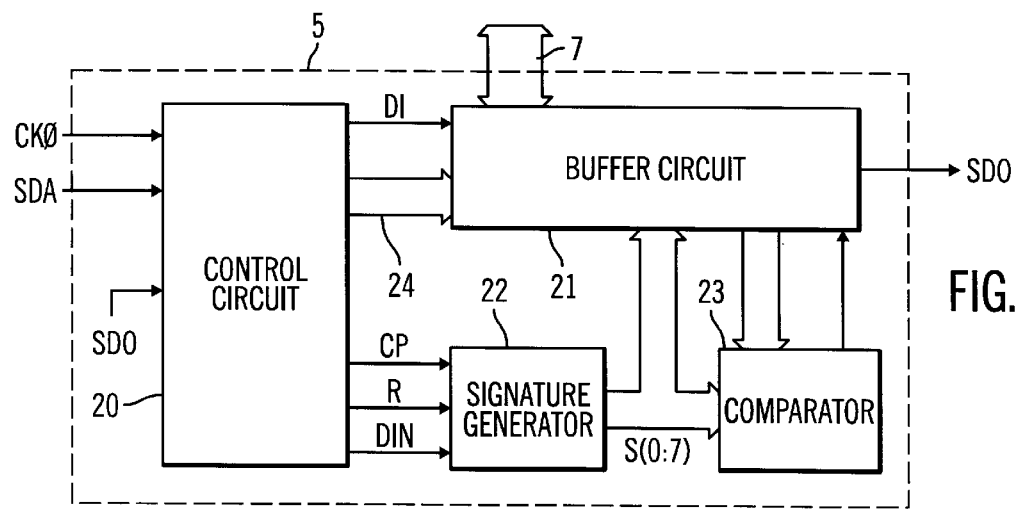
FIG. 2 is a block diagram of a protocol management circuit according to a preferred embodiment of the present invention.

FIG. 2 shows a block diagram of a preferred embodiment of the protocol management circuit of FIG. 1. The protocol management circuit 5 has a control circuit 20, a buffer circuit 21, a signature generator circuit 22, and a comparator 23. The control circuit 20 verifies the integrity of a frame, decodes the frame, and gives the word contained in the frame to the buffer circuit 21 and to the signature generator circuit 22 with appropriate control signals. The control circuit 20 has a first input receiving the clock signal CK0, a second input receiving signal SDA, and a third input receiving signal SDO, which is produced by the buffer circuit 21.

The control circuit 20 furthermore has a control bus 24 to give the buffer circuit 21 various signals that identify the data elements received as being instructions, addresses, data, or signatures. The control bus 24 also transmits synchronization signals, especially to enable the sending of data elements and the sending of messages of good (or poor) reception. The control circuit 20 also gives the buffer circuit 21 a signal DI that corresponds to the serial transmission of the bits constituting the words received. The control circuit 20 gives the signature generator circuit 22 a clock signal CP, a resetting signal R, and a data signal DIN that is described in detail hereinafter.

The buffer circuit 21 includes shift registers having serial inputs and outputs as well as parallel inputs and outputs. The data received from the control circuit 20 by means of signal SDO is stored in a shift register that corresponds to the type of data (address, data, instruction, or signature) to be given on the bus 7 in parallel. Furthermore, the data elements contained in the registers may be given serially by means of signal SDO in order to be modulated.

The buffer circuit furthermore has a signature input S(0:7) connected to the output of the signature generator circuit to store a signature corresponding to the data transmitted and a signature output to give the comparator 23 the signature received so that it can be compared with the signature computed by the signature generator for the previously received words. A validity signal input enables the buffer circuit to know whether the result of the comparison is valid or not. The buffer circuit 21 is also provided with two non-volatile registers respectively containing a message of good reception and a message of poor reception, which it may give by means of signal SDO. The signal of poor reception is given even if the control circuit 20 reports a frame parity error or if the comparator 23 indicates that the comparison shows an error.

Figure 3:
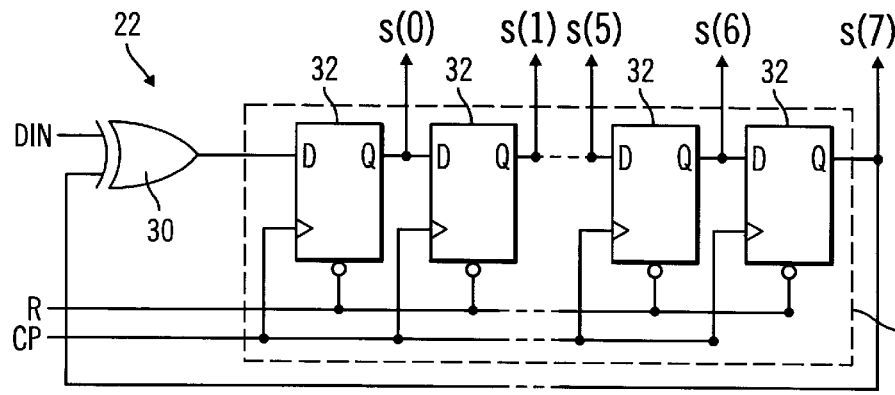
FIG. 3 is a schematic view of a signature generator circuit according to a first embodiment of present invention.
Figure 4:
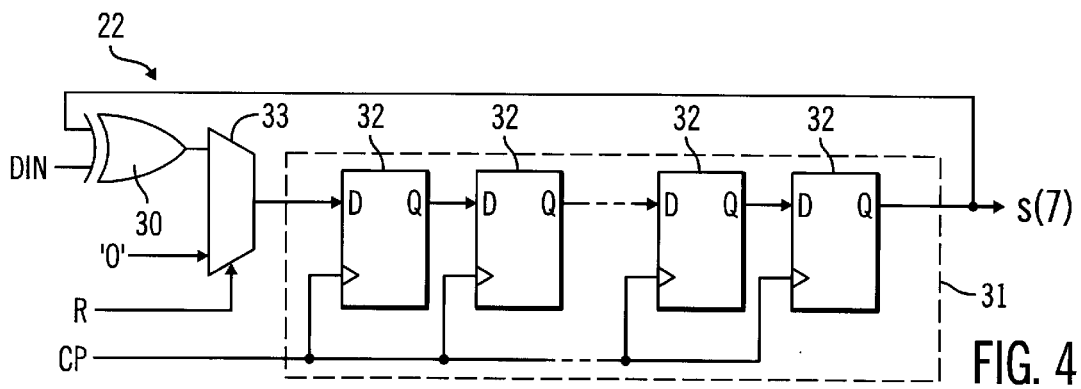
FIG. 4 is a schematic view of a signature generator circuit according to a second embodiment of present invention.

Two exemplary embodiments of the signature generator circuit of FIG. 2 are shown in FIGS. 3 and 4. The signature generator circuit 22 includes a logic gate 30 (for example, of the XOR type) with two inputs and one output. The gate 30 receives signal DIN serially at one of its inputs. A shift register 31 has a series input, a clock input, and a series output. The clock input receives the clock signal CP that sets the rate of the words, the series input is connected to the output of the logic gate 30, and the series output is connected to the other input of the gate 30.

In the embodiment of FIG. 3, the shift register 31 is constituted by eight D-type flip-flop circuits 32 with asynchronous resetting. The resetting inputs of the flip-flop circuits are connected together to form an asynchronous resetting input for the register 31, with the asynchronous resetting input receiving a signal R. Furthermore, the output of each of the flip-flop circuits S(0) to S(7) forms the parallel output S(0:7) of the register 31. The parallel output S(0:7) makes it possible to output the word contained in the register.

The signature generator circuit 22 of FIG. 3 operates as follows. The control circuit 20 sends a resetting pulse on signal R in order to reset all the flip-flop circuits 32 of the register 31. When a frame is verified by the control circuit and if it pertains to an instruction of an address or data, then the control circuit provides the word contained in the frame in series by means of signal DIN, which has its rate set by the clock signal CP. The successive shifting of the instruction, address, and data words received in the circuit has the effect of giving a bit-by-bit XOR operation between the different words. When the signature word is received by the control circuit 20, a signature word is already present in the register 31. The control circuit 20 then gives the signature word received at the buffer circuit 21 and a comparison is made in the comparator 23 with the signature contained in the register 31, which is given by the parallel output S(0:7).

When data is sent by the integrated circuit 1, the control circuit sends a pulse on signal R to reset the register 31 and then the buffer circuit 21 sends the frame or frames corresponding to the data word or words to be transmitted on signal SDO under the control of the control circuit 20. The control circuit 20 decodes the frames and gives the words to the generator circuit 22 successively. When the totality of the words has been sent, the signature present in the register 31 is transmitted to the buffer circuit to be sent in the form of a frame.

The use of the generator circuit 22 makes it possible to remove the constraint of the number of words to be transmitted, and thereby makes it possible to have a structure that is non-specific to a number of words. This structure also makes it possible to gain space in terms of surface area because there is no need to have eight parity computing devices in parallel on the registers of the words received or to be transmitted.

FIG. 4 shows another embodiment of the signature generator circuit in which the signature word is output in series. The generator circuit 22 differs in that the register 31 has no parallel output or resetting input. However, the generator circuit 22 has a multiplexer 33 with two inputs and an output. One of the inputs is connected to the output of the logic gate 30, the output is connected to the series input of the register 31, and the other input of the multiplexer 33 receives a logic zero. A selection input of the multiplexer 33 receives signal R. The operation of the generator circuit of FIG. 4 differs with respect to the resetting of the register 31 and the retrieval of the signature contained in the register. Indeed, in parallel to the serial output of the signature word, signal R is activated so as to propagate a zero in the register 31 in order to reset it for the next signature computation.

The circuit of FIG. 4 has an advantage (with respect to the circuit of FIG. 3) in that the sizes of the buffer circuit 21 and the comparator 23 are reduced. Indeed, it is possible to use a series comparator, which is more compact than a parallel comparator, and it is no longer necessary to have a register in the buffer circuit 21 to memorize the signature before the comparison or before the transmission. However, the circuit of FIG. 4 needs a resetting sequence during the powering on of the integrated circuit 1. This may be undesirable in certain applications.

In the embodiments of the present invention described above, the logic gate is an XOR logic gate. However, in further embodiments, other types of logic gates such as EXCLUSIVE-NOR gates are used. Similarly, the registers 31 described above consist of eight D-type flip-flop circuits for storing 8-bit words. However, in further embodiments, a size greater than eight bits is used. In such cases, a register with more than eight flip-flop circuits is used.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A signature generator circuit for generator a signature word relating to a plurality of words, said signature generator circuit comprising:
    a logic gate receiving the plurality of words in series at one input;
    a shift register having a data input, a clock input, and a register output; and
    a multiplexer having one input coupled to the output of the logic gate, another input that receives a logic zero, and an output coupled to the data input of the shift register,
    wherein the clock input receives a clock signal that sets the rate of the plurality of words, the data input is coupled to an output of the logic gate, and the register output is coupled to another input of the logic gate.

2. The signature generator circuit as defined in claim 1, wherein the shift register also has a parallel output for outputting the contents of the shift register.

3. The signature generator circuit as defined in claim 2, wherein the shift register also has an asynchronous resetting input for resetting the contents of the shift register using a pulse.

4. The signature generator circuit as defined in claim 1, wherein the shift register also has an asynchronous resetting input for resetting the contents of the shift register using a pulse.

5. The signature generator circuit as defined in claim 1, wherein the logic gate is an XOR gate.

6. An integrated circuit for use in a contactless device, the integrated circuit including a protocol management circuit that determines a signature on a plurality of words, the protocol management circuit comprising:
    a logic gate receiving the plurality of words in series at one input;
    a shift register having a data input, a clock input, and a register output; and
    a comparator coupled to the shift register, the comparator comparing the signature determined by the protocol management circuit with a received signature,
    wherein the clock input receives a clock signal that sets the rate of the plurality of words, the data input is coupled to an output of the logic gate, and the register output is coupled to another input of the logic gate.

7. The integrated circuit as defined in claim 6, wherein the protocol management circuit further comprises a buffer circuit coupled to the comparator, the buffer circuit storing the received signature.

8. An integrated circuit for use in a contactless device, the integrated circuit including a protocol management circuit that determines a signature on a plurality of words, the protocol management circuit comprising:
    a logic gate receiving the plurality of words in series at one input;
    a shift register having a data input, a clock input, and a register output; and
    a multiplexer having one input coupled to the output of the logic gate, another input that receives a logic zero, and an output coupled to the data input of the shift register,
    wherein the clock input receives a clock signal that sets the rate of the plurality of words, the data input is coupled to an output of the logic gate, and the register output is coupled to another input of the logic gate.

9. The integrated circuit as defined in claim 8, wherein the shift register also has a parallel output for outputting the contents of the shift register.

10. The integrated circuit as defined in claim 6, wherein the shift register also has an asynchronous resetting input for resetting the contents of the shift register using a pulse.

11. The integrated circuit as defined in claim 8, wherein the logic gate is an XOR gate.

12. A method for generator a signature relating to a plurality of words using a logic gate and a shift register, said method comprising the steps of:
    resetting the contents of the shift register;
    supplying one of the words in series to the logic gate;
    supplying the contents of the shift register to the logic gate;
    storing the output of the logic gate in the shift register; and
    repeating the supplying, supplying, and storing steps for each of the words,
    wherein the resetting step includes the sub-step of propagating a zero through the shift register.

13. The method as defined in claim 12, further comprising a step of retrieving the signature from the shift register.

14. The method as defined in claim 13, wherein the retrieving step includes the sub-step of outputting the contents of the shift register in parallel.

15. The method as defined in claim 13, wherein the retrieving step includes the sub-step of outputting the contents of the shift register in series.

16. The method as defined in claim 12, further comprising the step of performing an XOR operation in the logic gate.

17. A method for generator a signature relating to a plurality of words using a logic gate and a shift register, said method comprising the steps of:

resetting the contents of the shift register;

supplying one of the words in series to the logic gate;

supplying the contents of the shift register to the logic gate;

storing the output of the logic gate in the shift register;

repeating the supplying, supplying, and storing steps for each of the words;

retrieving the signature from the shift register; and using a comparator to compare the signature retrieved from the shift register with a received signature.

18. The method as defined in claim 17, further comprising the step of storing the received signature in a buffer circuit.

* * * * *

UNITED STATES PATENT AND TRADEMARK OFFICE
CERTIFICATE OF CORRECTION

PATENT NO. : 6,300,791 B1
DATED : October 9, 2001
INVENTOR(S) : Manish Jain

Page 1 of 1

It is certified that error appears in the above-identified patent and that said Letters Patent is hereby corrected as shown below:

<u>Column 5,</u>
Line 50, from "generator" to -- generating --

<u>Column 6,</u>
Line 54, from "generator" to -- generating --

<u>Column 7,</u>
Line 11, from "generator" to -- generating --

Signed and Sealed this

Nineteenth Day of March, 2002

Attest:

*Attesting Officer*

JAMES E. ROGAN
*Director of the United States Patent and Trademark Office*